(12) United States Patent
Lee

(10) Patent No.: US 6,995,591 B2
(45) Date of Patent: Feb. 7, 2006

(54) REGISTER CONTROLLED DELAY LOCKED LOOP WITH LOW POWER CONSUMPTION

(75) Inventor: Jae-Jin Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 25 days.

(21) Appl. No.: 10/745,979

(22) Filed: Dec. 24, 2003

(65) Prior Publication Data

US 2004/0239388 A1 Dec. 2, 2004

(30) Foreign Application Priority Data

May 31, 2003 (KR) ................ 10-2003-0035136

(51) Int. Cl.
*H03L 7/06* (2006.01)

(52) U.S. Cl. ................ 327/158; 327/149
(58) Field of Classification Search ........... 327/141, 327/147, 149–150, 152–153, 156, 158–159, 327/161

See application file for complete search history.

(56) References Cited

U.S. PATENT DOCUMENTS

| | | | | |
|---|---|---|---|---|
| 5,936,912 | A | * | 8/1999 | Kawabata et al. .......... 365/233 |
| 6,031,788 | A | * | 2/2000 | Bando et al. ............... 365/233 |
| 6,137,334 | A | * | 10/2000 | Miller et al. ................ 327/271 |
| 6,377,100 | B1 | * | 4/2002 | Fujieda ....................... 327/262 |
| 6,377,101 | B1 | * | 4/2002 | Eto et al. .................... 327/270 |
| 6,556,643 | B2 | * | 4/2003 | Merritt ......................... 377/16 |
| 6,593,786 | B2 | * | 7/2003 | Jung .......................... 327/158 |
| 6,608,514 | B1 | * | 8/2003 | Akita et al. ................. 327/291 |
| 6,768,690 | B2 | * | 7/2004 | Kwon et al. ................ 365/194 |
| 6,822,494 | B2 | * | 11/2004 | Kim ............................ 327/160 |

* cited by examiner

*Primary Examiner*—Timothy P. Callahan
*Assistant Examiner*—Cassandra Cox
(74) *Attorney, Agent, or Firm*—Blakely, Sokoloff, Taylor & Zafman

(57) ABSTRACT

The present invention relates to a digital delay locked loop (DLL) in DDR SDRAM (Double Data Rate Synchronous DRAM). The digital delay locked loop according to the present invention includes: first and second delay lines, each of which includes a plurality of delay groups, for delaying a source clock signal and a delay monitoring signal, wherein each of the delay groups include a plurality of programmable unit delayers; a delay model receiving an output signal of the second delay line for modeling a delay component of a clock signal path; a comparator for comparing a feedback clock signal from the delay model with a reference clock signal; a delay controller for controlling an amount of delay time of the first and second delay lines in response to a comparison result of the comparator; and first and second clock input controllers, which selectively provides the source clock signal and the delay monitoring clock signal to one of delay groups in the first and second delay lines, respectively, in response to output signals of the delay controller.

19 Claims, 9 Drawing Sheets

REGISTER CONTROLLED DELAY LOCKED LOOP WITH LOW POWER CONSUMPTION

FIELD OF THE INVENTION

The present invention relates to a semiconductor device; and, more particularly, to a digital delay locked loop (DLL) in a Double Data Rate Synchronous (DRAM DDR SDRAM).

BACKGROUND OF THE INVENTION

Generally, a clock signal has been used as a reference signal which is synchronized with an operation timing in a system or an electronic circuit and this clock signal has been used for high-speed performance of an integrated circuit without an error. When a clock signal from an external circuit is used in an internal circuit, a delay of the clock signal, which is said "clock skew", is generated in the internal circuit. To prevent this skew in the internal circuit, a DLL to synchronize an internal clock signal with an external clock signal has been employed.

On the other hand, as compared with a conventional phase locked loop (PLL), the DLL has a merit in that it has an effect on the noise so that the DLL has been used in SDRAMs (Synchronous DRAM) and DDR SDRAMs (Double Data Rate Synchronous DRAM). A register controlled DLL, which is digitally done in controlling its phase, has been widely used. The register controlled DLL in the Synchronous DRAM compensates for a delay time of an internal clock signal, which is produced by an external clock signal, and makes data output signal synchronized with the external clock signal by reflecting a negative delay time on the internal clock signal path.

Referring to FIG. 1, a register controlled DLL of a conventional DDR SDRAM includes a clock buffer 10, a clock divider 11, a phase comparator 16, a delay line 12, a dummy delay line 13, a shift register 17, a shift register controller 18, a DLL driver 14, and a delay model 15. The clock buffer 10 buffers an external clock signal CLK and generates a source clock signal clk which is synchronized with a rising or falling edge of the external clock signal CLK. The clock divider 11 divides the source clock signal clk into M (integer, typically M=8) divided clock signals and generates a monitoring clock signal fb_div and a reference clock signal ref. The delay line 12, which includes a plurality of programmable unit delayers, receives the source clock signal clk from the clock buffer 10. The dummy delay line 13 having the same structure as the delay line 12 also includes a plurality of programmable unit delayers. The shift register 17 determines an amount of delay time in both the delay line 12 and the dummy delay line 13 and the delay model 15 delays the delay signal from the dummy delay line 13 using the actually same delay path of the source clock signal clk. The phase comparator 16 compares the reference clock signal ref from the clock divider 11 with a feedback clock signal fb_dm and the shift register controller 18 controls the shift register 17 in response to the comparison signal from the phase comparator 16 in order that the shift register 17 determines the delay amount of the delay line 12 and the dummy delay line 13. It should be noted that the delay model 15 includes the same delay path as the clock buffer 10 and a data output buffer (not shown).

The clock divider 11 produces M divided clock signals using the source clock signal clk in order to generate the monitoring clock signal fb_div and the reference clock signal ref. Accordingly, the monitoring clock signal fb_div and the reference clock signal ref are synchronized with an M-th external clock signal CLK. Typically, the monitoring clock signal fb_div and the reference clock signal ref are out of phase; however, this phase difference is not inevitably required in the register controlled DLL. The clock divider 11 is employed to reduce the power consumption of the DLL and to avoid the complexity of a control logic circuit to be required with the increase of operating frequency. Accordingly, it is possible to remove the clock divider 11 from the DLL if such a requirement is not wanted.

In the DLL using the shift register, the delay monitoring clock signal fb_div passes through one of the unit delayer in the dummy delay line 13 and is also delayed by a predetermined amount of delay time in the delay model 15. The comparator 16 compares a rising edge of the reference clock signal ref with a rising edge of the feedback clock signal fb_dm from the delay model 15 and the shift register controller 18 outputs shift control signals SR (shift right) and SL (shift left) to controls the shift register 17 in response to a comparison signal from the comparator 16.

The shift register 17 enables one of unit delayers in the delay line 12 and the dummy delay line 13 in response to the shift control signals SR and SL in order to determine an amount of delay time in the delay line 12 and the dummy delay line 13. At this time, when the shift control signal SR is activated, the shift registers shifts an input bit signal to the right one-by-one and when the shift control signal SL is activated, the shift registers shifts an input bit signal to the left one-by-one. A locking operation is achieved when the comparison of the reference clock signal ref and the feedback clock signal fb_dm has a minimum jitter. When the DLL is locked, a locking signal (not shown) is issued therein and the DLL driver 14 outputs a DLL clock signal clk_dll which is newly generated and is synchronized with the external clock signal CLK.

Referring to FIG. 2, the delay line 12 includes n unit delayers UD1 to UDn which are in series coupled to each other. Each of the unit delayers includes a first NAND gate NAND100 receiving an input clock signal clk_in and one of delay selection signals Reg_1 to Reg_n from the shift register 17, a second NAND gate NAND 101 receiving an output signal of the first NAND gate NAND100 and an output signal of a previous unit delayer, and an inverter INV100 inverting an output signal of the second NAND gate NAND 101. The first unit delayer UD1 is coupled to a power supply VDD because there is no previously delayed signal.

For example, in the unit delayer UD4, in case that the delay selection signal Reg_3 is in a high voltage level, the firat NAND gate NAND100 is enabled and the input clock signal clk_in is inverted. As a result, the second NAND gate NAND 101 and the inverter INV100 delay the input clock signal clk_in. In case that the delay selection signal Reg_3 is in a low voltage level, the firat NAND gate NAND100 is disenabled and the input clock signal clk_in is blocked. As a result, an output signal of the first NAND gate NAND 100 is in a high voltage level and the second NAND gate NAND 101 and the inverter INV100 delay an output signal from the previous unit delayer UD3 for a predetermined time.

Referring to FIG. 3, the shifter register 22 is made up of n stages. Only four stages are shown In FIG. 3 and only one stage to produce a delay selection signal Reg_2 will be illustrated. Each of the stages includes a latch circuit L consisting of a NAND gate NAND102 and an inverter INV101, a switching part S for selecting one from the latched values in response to shift signals sre, sro, slo, sle, and a logic combiner C for logically combining a positive output signal (Q) of the latch circuit L in a current stage and a negative output signal (/Q) of an latch circuit L in the previous stage. In the latch circuit L, the AND gate NAND102 receives a reset signal resetb, as an initial signal, and an inverted signal /Q and an inverter INV101 receives an output signal of the NAND gate NAND102 and outputs the inverted signal (/Q) to the NAND gate NAND102. At the initialization, the positive output signals (Q) of all the latch circuits are in a high voltage level.

The switching part S includes: an NMOS transistor M4, which is connected to a positive output terminal of the latch circuit L, having a gate receiving a negative output signal (/Q) of the latch circuit L in the previous stage; an NMOS transistor M3, which is connected to a negative output terminal of the latch circuit L, having a gate receiving a negative output signal (/Q) of the latch circuit L in the next stage; an NMOS transistor M1 to selectively connect the negative output terminal of the latch circuit L to a ground voltage level in response to an odd shift-right signal sro together with the NMOS transistor M3; and an NMOS transistor M2 to selectively connect the positive output terminal of the latch circuit L to a ground voltage level in response to an even shift-left signal slo together with the NMOS transistor M4. The switching parts S in the previous and next stages are controlled by both an even shift-right signal sre and an odd shift-left signal slo of the shift signals sre, sro, slo and sle.

The logic combiner C has a NAND gate NAND103 receiving both the positive output signal (Q) of the latch circuit L in the current stage and the negative output signal (/Q) of the latch circuit L in the previous stage and an inverter INV102 to receive and invert an output signal of the NAND gate NAND103. In the shifter register 22, latched values of all the stages are, at the initial operation, in a high voltage level by a reset signal resetb and the delay selection signals Reg_1, Reg_2, . . . , Reg_n are 1, 0, . . . , 0, respectively. Even if the continuous shift operations are carried out, one of the delay selection signals Reg_1 to Reg_n is in a high voltage level. Accordingly, in the delay line of FIG. 2, one of the unit delayers is enabled and the input clock signal clk_in is inputted into only one enabled unit delayer. As a result, other unit delayers are served as a load.

FIG. 4 is a schematic view illustrating the conventional shift register and the delay line. Referring to FIG. 4, if the delay selection signal Reg_7 from the shift register 17 is in a high voltage level and the others are in a low voltage level, the seventh unit delayer UD7, which are positioned in both the delay line 12 and the dummy delay line 13, are enabled. Accordingly, the source clock signal clk and the delay monitoring clock fb_div are inputted into the seventh unit delayer UD7, thereby passing through the delay line 12 and the dummy delay line 13. In this case, other unit delayers, except for the seventh unit delayers UD7, are served as a load of the source clock signal clk and the delay monitoring clock fb_div because all of other delay selection signals are in a low voltage level.

In the 256M DDR SDRAM, the power consumption caused by this load leads the current loss of 2 to 4 mA at the normal operation region of 100 to 200 MHz. The register controlled DLL in the synchronous memory devices is considerably associated with data output operation. For example, since the conventional register DLL drives the delay line beside the read operation, the more power consumption is caused in the conventional register controlled DLL.

Further to the above-mentioned power consumption, the conventional register controlled DLL has a drawback in the signal integrity. That is, since the clock buffer drives a large load, the output signal of the clock buffer may be fluctuated considerably according to the variation of the power supply voltage. These problems appear in other digital DLL as well as the above-mentioned register controlled DLL.

SUMMARY OF THE INVENTION

It is, therefore, a primary object of the present invention to provide a digital locked loop (DLL) capable of minimizing power consumption in a DDR SDRAM (Double Data Rate Synchronous DRAM).

In accordance with an aspect of the present invention, there is provided a digital delay locked loop including: first and second delay lines, each of which includes a plurality of delay groups, for delaying a source clock signal and a delay monitoring signal, wherein each of the delay groups include a plurality of programmable unit delayers; a delay model receiving an output signal of the second delay line for modeling a delay component of a clock signal path; comparing means for comparing a feedback clock signal from the delay model with a reference clock signal; delay control means for controlling an amount of delay time of the first and second delay lines in response to a comparison result of the comparing means; and first and second clock input control means, which selectively provides the source clock signal and the delay monitoring clock signal to one of delay groups in the first and second delay lines, respectively, in response to output signals of the delay control means.

In accordance with another aspect of the present invention, there is provided a digital delay locked loop which includes a clock buffer, a clock divider, a phase comparator, a delay line, a dummy delay line, a shift register, a shift register controller, a DLL driver, and a delay model, the digital delay locked loop comprising: first and second clock input control means for controlling the delay line and the dummy delay line, respectively in response to a read command from a memory controller, wherein each of the delay line and the dummy delay line includes a plurality of delay group having a plurality of unit delayers, wherein the unit delayers are grouped into a plurality of delay groups, and wherein the first and second clock input control means control the delay groups.

In the present invention, a delay line is divided into a plurality of delay groups, each of which has a plurality of unit delayer. One of the plurality of delay groups is driven by an output signal of a delay control unit. As a result, total amount of a load of the delayers is reduces in an operation mode. Since the delay line to which a source clock signal is applied is needed in an actual read operation, a control logic circuit is provided in the present invention in order that the source clock signal is transferred to the delay line in response to a read section signal, thereby reducing power consumption.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, a digital DLL for a SDRAM according to the present invention will be described in detail accompanying the drawings.

Figure 5:
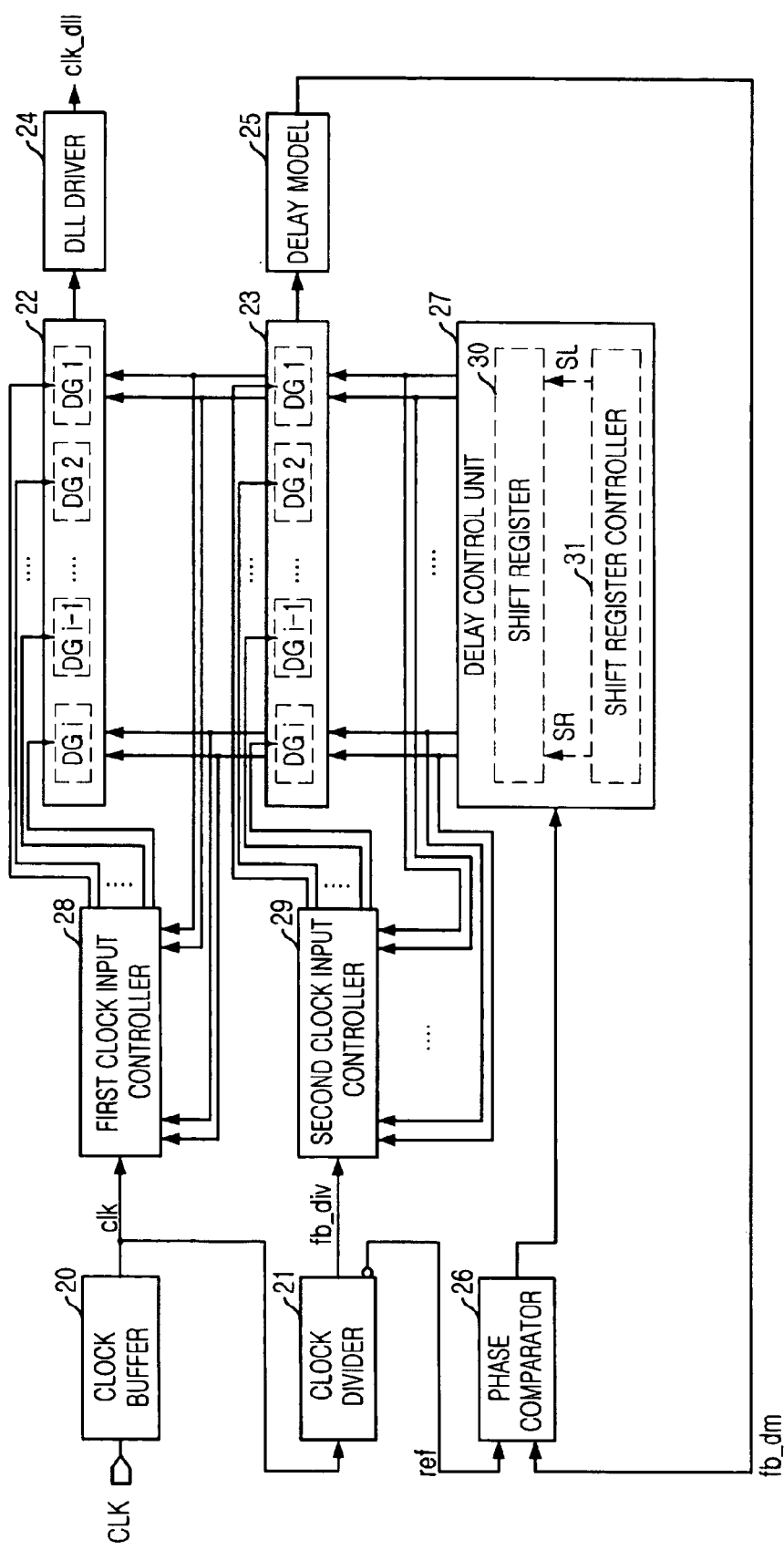
FIG. 5 is a schematic diagram of a digital DLL in a SDRAM device according to the present invention.

First, referring to FIG. 5, the digital DLL according to the present invention includes a clock buffer 20, a clock divider 21, a phase comparator 26, a delay line 22, first and second clock input controllers 28 and 29, a dummy delay line 23, a delay control unit 27, a DLL driver 24, and a delay model 25.

The clock buffer 20 buffers an external clock signal CLK and generates a source clock signal clk which is synchronized with a rising or falling edge of the external clock signal CLK. The clock divider 21 divides the source clock signal clk into M (integer, typically M=8) divided clock signals and generates a monitoring clock signal fb_div and a reference clock signal ref. The delay line 22, which includes a plurality of delay groups having programmable unit delayers, delays the source clock signal clk from the clock buffer 20. The dummy delay line 23 having the same structure as the delay line 22 also includes a plurality of delay groups having programmable unit delayers and delays the monitoring clock signal fb_div. The delay model 25 receives an output signal of the dummy delay line 23 and delays the delay signal from the dummy delay line 23 using the actually same delay path of the source clock signal clk. The phase comparator 26 compares the reference clock signal ref from the clock divider 11 with a feedback clock signal fb_dm from the delay model 25. The delay control unit 27 controls an amount of delay time of the delay line 22 and the dummy delay line 23 in response to an output signal of the phase comparator 26. The first clock input controller 28 selectively controls one of the delay groups in the delay line 22 to delay the source clock signal clk in response to an output signal of the delay control unit 27. The second clock input controller 29 also selectively controls one of the delay groups in the dummy delay line 23 to delay the delay monitoring clock signal fb_div.

In the case that the digital DLL is a register controlled DLL, the delay control unit 27 includes a shift register controller 31 to produce shift control signals SL and SR in response to a comparison result of the phase comparator 26 and a shift register 30 to determine an amount of delay time in the delay line 22 and the dummy delay line 23. Typically, the monitoring clock signal fb_div and the reference clock signal ref are out of phase; however, this phase difference is not inevitably required in the register controlled DLL. The clock divider 21 is employed to reduce the power consumption of the DLL and to avoid the complexity of a control logic circuit to be required with the increase of operating frequency. Accordingly, it is possible to remove the clock divider 21 from the digital DLL if such a requirement is not wanted. Each of the delay line 22 and the dummy delay line 23 includes i delay groups and each delay group includes a plurality of unit delayers which are driven by clock signals from the first and second clock input controller 28 and 29.

Figure 6:
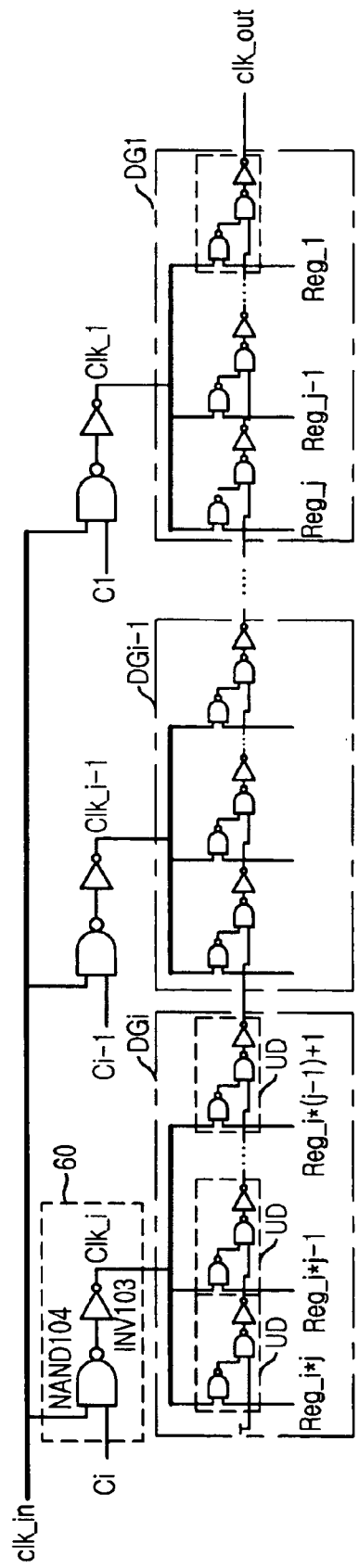
FIG. 6 is a block diagram of a delay line and a portion of a clock input controller in FIG. 5.

FIG. 6 is a block diagram of the delay line and a part of the clock input controller in FIG. 5. According to one embodiment of the present, the delay line 22 and the dummy delay line 23 have the same scheme and the first and second clock input controller 28 and 29 also have the same scheme.

Referring to FIG. 6, the delay line 22 has the same number of unit delayers as the conventional delay line and the unit delayer also has the same as the conventional unit delayer; however, the unit delayer can be different from the conventional unit delayer. The delay line 22 includes i delay groups $DG1, \ldots DGi-1, DGi$ and each delay group include j unit delayers. The unit delayers associated with one delay group are coupled to one common clock line and each of the delay groups has a different clock lines.

Each of the clock input controllers 28 and 29 includes a control logic circuit 60 that provides an input clock signal clk_in for a clock line in one the delay group in response to a delay group control signal $C<1:i>$. For example, the control logic circuit 60 corresponding to the last delay group DGi includes a NAND gate NAND104 which receives the delay group control signal Ci and the input clock signal clk_in and an inverter INV103 to invert an output signal of the NAND gate NAND104. When the delay group control signal Ci is activated in a high voltage level, the input clock signal clk_in passes through the NAND gate NAND104 and the inverter INV103 and then a clock signal Clk_i is produced in the control logic circuit 60. The clock signal Clk_i drives the i-th delay group DGi. At this time, the control logic circuits in other delay groups DGi-1 to DG1 are disabled so that the input clock signal clk_in is not transferred to other control logic circuits. The delay group control signal $C<1:i>$ will be described below in detail.

Figure 7:
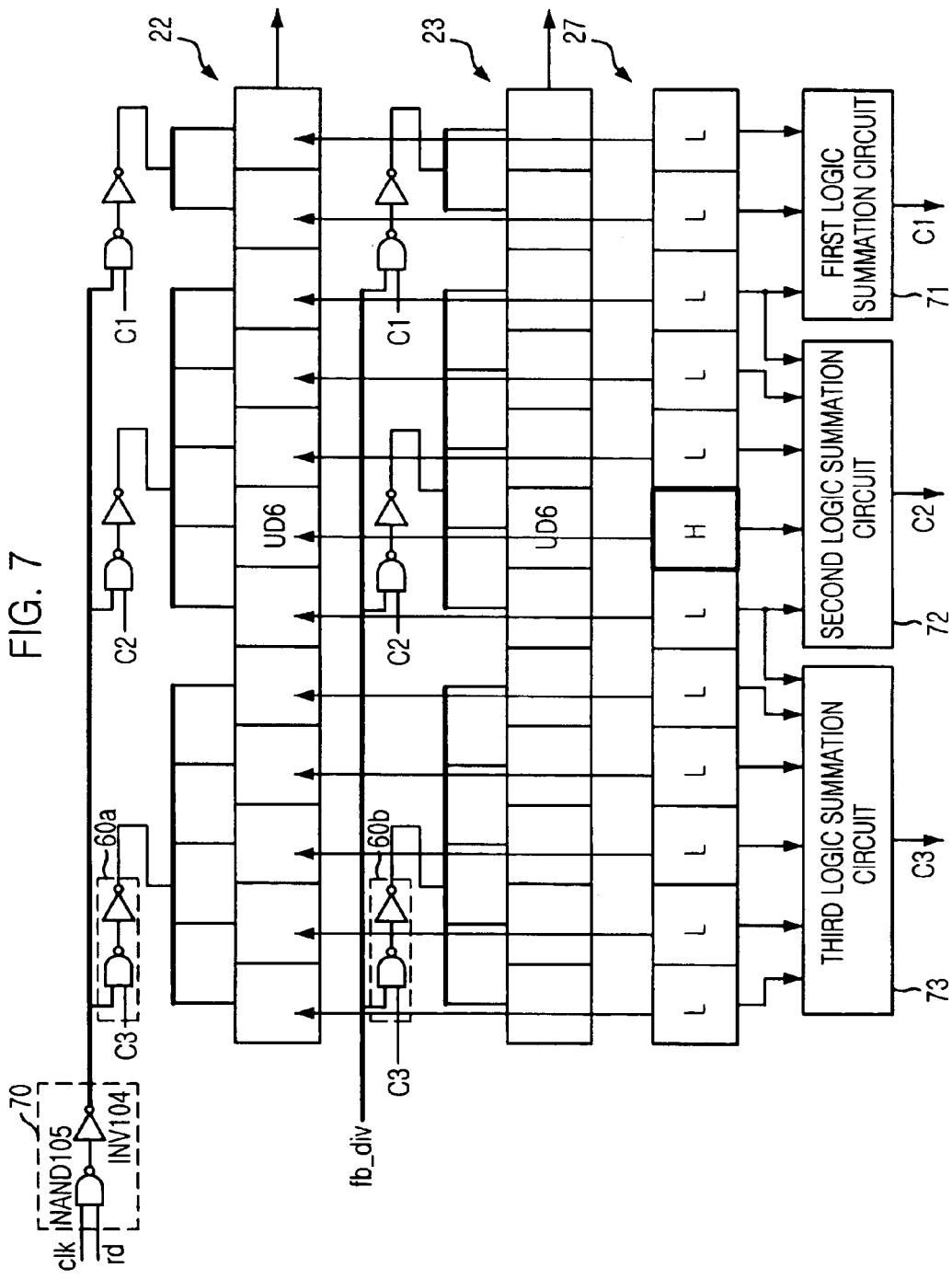
FIG. 7 is a schematic diagram illustrating the delay line, a dummy delay line, a delay control unit and first and second clock input controller in FIG. 5.

FIG. 7 is a schematic diagram illustrating the delay line 22, the dummy delay line 23, the delay control unit 27 and the first and second clock input controller 28 and 29 in FIG. 5. Each of the delay line 22 and the dummy delay line 23 has 12 unit delayers and these are divided into three groups.

Referring to FIG. 7, the delay control unit 27 outputs only one high voltage signal corresponding to one unit delayer and other signals are in a low voltage level. The output signals of the delay control unit 27 are divided and outputted into first to third logic summation circuits 71 to 73. Each of the first to third logic summation circuits 71 to 73 logically sums the output signals of the delay control unit 27 and outputs delay group control signals C1 to C3.

The delay group control signals C1 to C3 are respectively applied to the control logic circuits 60a and 60b which are correspondent to each delay group in the delay line 22 and the dummy delay line 23 in order to select a specific group. Since the control logic circuits 60a and 60b are the same as the control logic circuit 60 in FIG. 6, the detailed description will be omitted.

In FIG. 7, a sixth unit delayer UD6 is selected. In this case, the delay group control signal C2 is activated in a high voltage level and other delay group control signals C1 and C3 are in a low voltage level. Accordingly, a control logic circuit which is controlled by the delay group control signal C2 is enabled so that the corresponding delay group DG2 is driven. At this time, since other logic circuits are disabled, the delay groups corresponding to the disabled logic circuits do not receive the clock signal.

The clock signals clk and fb_div inputted into the unit delayer UD6 passes through the delay lines 22 and 23. At this time, since the clock signals clk and fb_div are not transferred to the clock line of the delay groups DG1 and DG3, the load of the clock signals is reduced and the power consumption is also minimized. Furthermore, since an amount of load which the clock buffer 20 drives is reduced, the variation of the output signal of the clock buffer 20 to the variation of the power supply is prevented and the signal integrity can be obtained.

The efficiency of the low power consumption may be achieved as the unit delayers in the delay line are much more provided and the number of the delay groups is much more provided. For example, in case where the delay line 22 has 100 unit delayers and these unit delayers are divided into 10 delay groups, 10 control logic circuits (60a) are required to the control the delay line. Accordingly, since the clock buffer 20 drives 10 control logic circuits and these 10 control logic circuits drive 10 unit delayers, load capacitor to carry out the charging/discharging operations is of 20. This is one-fifth of the conventional capacitance and also the current consumption is reduced by such a reduced capacitance.

In the first to third logic summation circuits 71 to 73, both the output signals of the delay control unit 27 and an output signal from a boundary in a lower delay group are summed. This prevents an error from being generated when the output signal of the delay control unit 27 is varied in the boundary in the delay group.

On the other hand, the first clock input controller 28 includes a control logic circuit 70 which selectively transfers the source clock signal clk in response to the read section signal rd. The control logic circuit 70 includes a NAND gate NAND105 receiving the source clock signal clk and the read section signal rd and an inverter INV104 receiving an output signal of the NAND gate NAND105. When the read section signal rd is applied to the control logic circuit 70 and the read section signal rd is activated in a high voltage level, the NAND gate NAND105 is enabled and the source clock signal clk is outputted through the inverter INV104. On the contrary, when the read section signal rd is in a low voltage level, the NAND gate NAND105 is disabled and the source clock signal clk is blocked.

Accordingly, the delay line 22 is driven only when the read operation (which requires the DLL clock clk_dll to be inputted into the memory) is needed and the delay line 22 is not driven when the DLL clock clk_dll is not needed, thereby reducing power consumption. The dummy delay line 23 monitors the jitter irrespective of the read operation so that this makes the delay locking state maintained when a read command is issued again. In case that the clock input controller 28 does not include the control logic circuit 70, the first and second clock input controllers 28 and 29 have the same scheme and the first clock input controller 28 can share the first to third logic summation circuits 71 to 73 with the second clock input controller 29.

Figure 8:
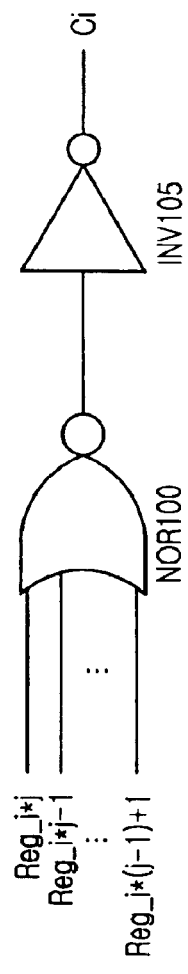
FIG. 8 is a schematic diagram of first to third logic summation circuits according to one embodiment of the present invention.

FIG. 8 is a schematic diagram of the first to third logic summation circuits 71 to 73 according to one embodiment of the present invention. Referring to FIG. 8, each of the first to third logic summation circuits 71 to 73 includes a NOR gate NOR100 receiving the delay selection signals Reg_i*j, Reg_i*j−1, . . . , Reg_i*(j−1)+1 of the corresponding delay groups and an inverter INV105 to inverter an output signal of the NOR gate NOR100 and to output the delay group control signal Ci.

Figure 9:
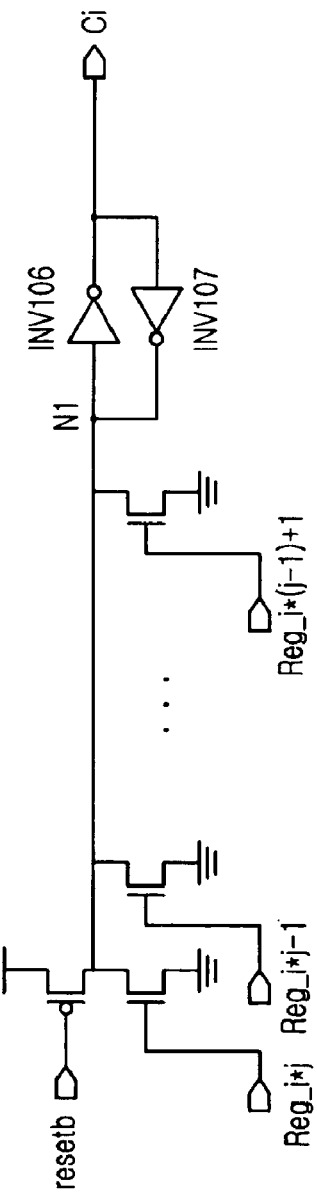
FIG. 9 is a schematic diagram of first to third logic summation circuits according to another embodiment of the present invention.

FIG. 9 is a schematic diagram of the first to third logic summation circuits 71 to 73 according to another embodiment of the present invention. Referring to FIG. 9, each of the first to third logic summation circuits 71 to 73 includes a PMOS transistor which transfers power supply Vdd to node N1 in response to the reset signal resetb, a plurality of NMOS transistors which are coupled between node N1 and a ground voltage level and which have a gate to receive the delay selection signals Reg_i*j, Reg_i*j−1, . . . , Reg_i*(j−1)+1, respectively, and a latch circuit having two inverters INV106 and INV107 to latch the potential on node N1. When the reset signal resetb is activated in a low voltage level, the stored value in the latch circuit is initialized in a low voltage level. At this time, one of the delay selection signals Reg_i*j, Reg_i*j−1, . . . , Reg_i*(j−1)+1 is activated in a high voltage level, node N1 is discharged and then the delay selection signal Ci is activated in a high voltage level.

Figure 1:
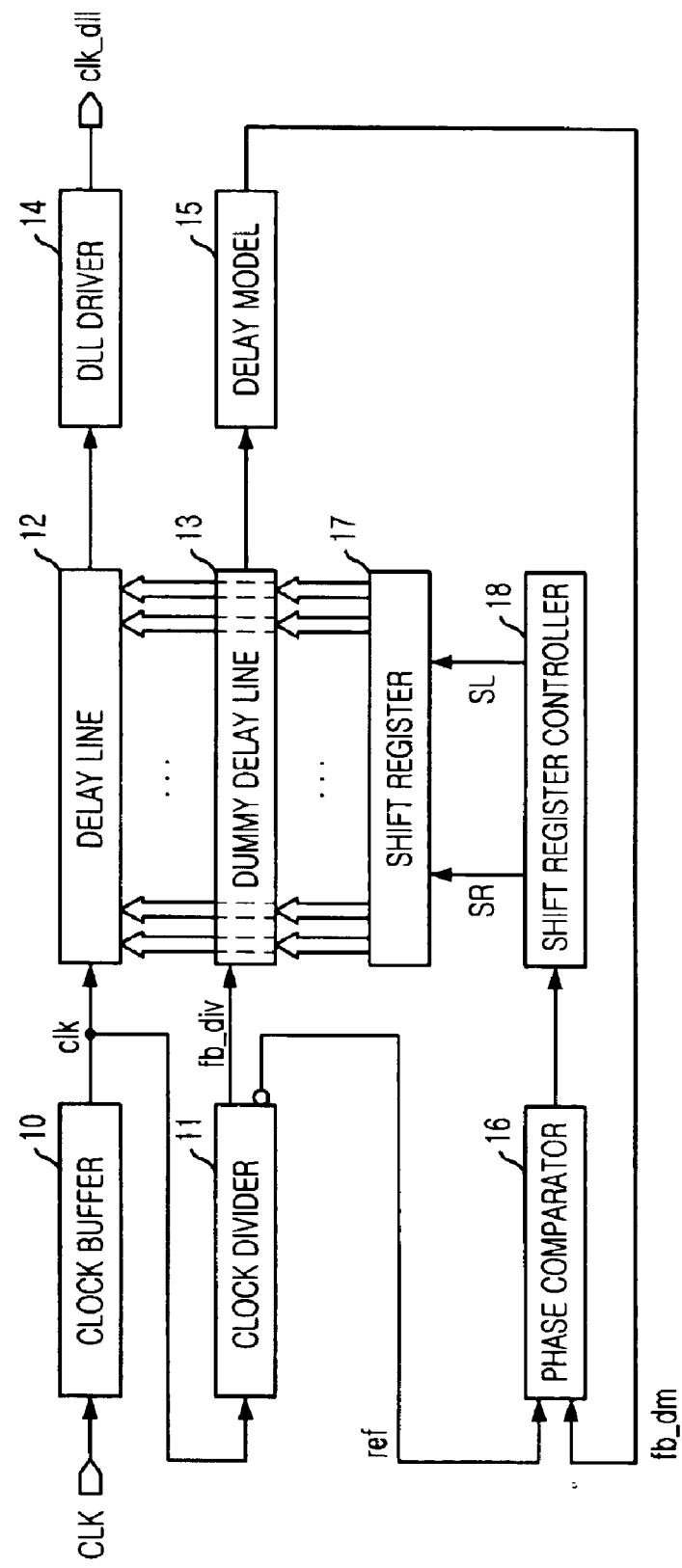
FIG. 1 is a schematic diagram of a conventional register controlled DLL in a SDRAM device.
Figure 2:
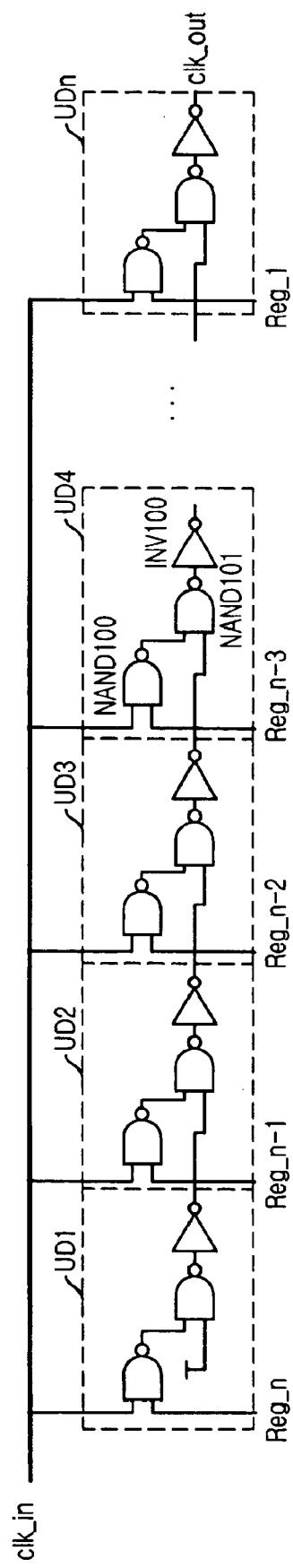
FIG. 2 is circuit diagram illustrating a delay line in FIG. 1.
Figure 3:
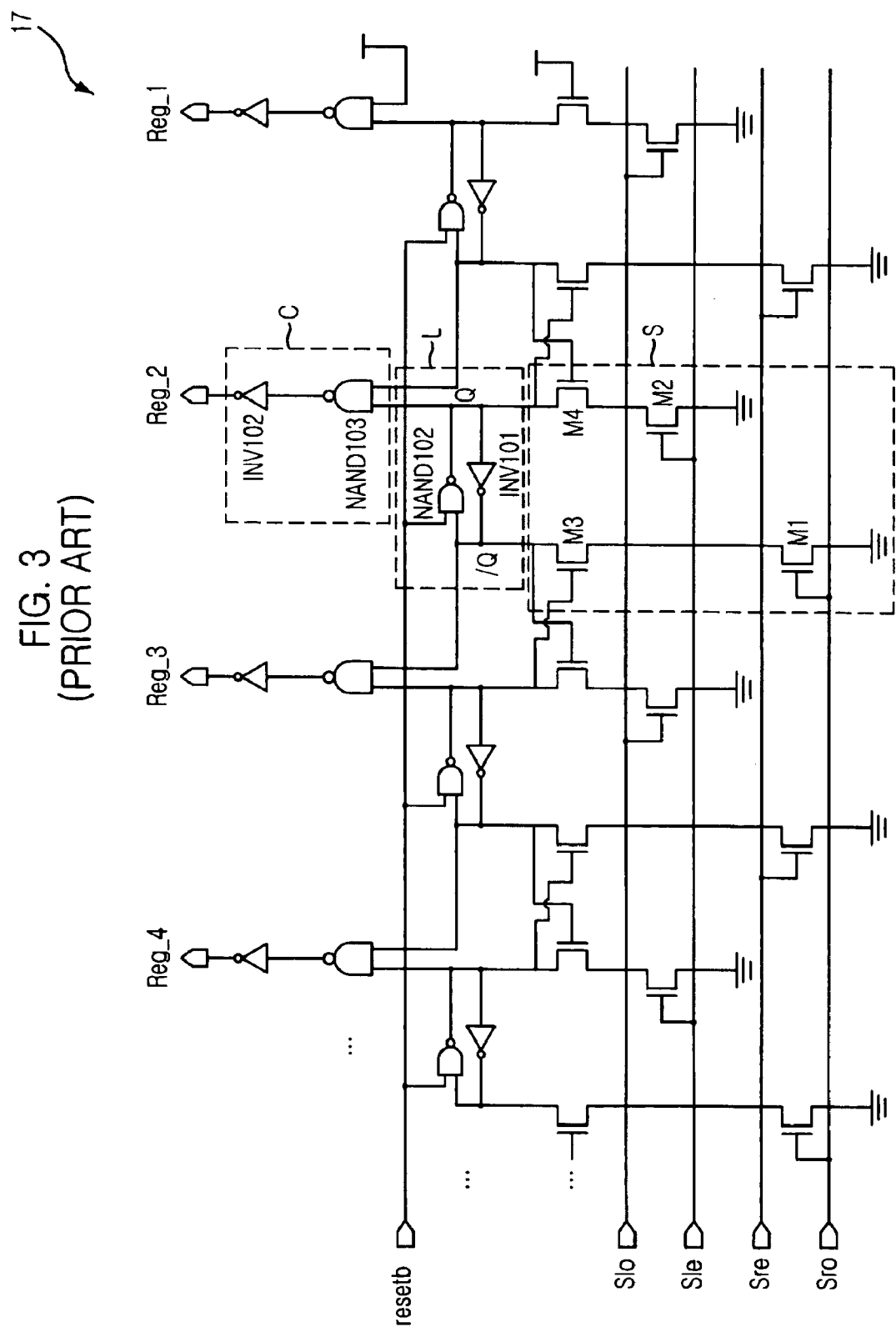
FIG. 3 is circuit diagram illustrating a shift register in FIG. 1.
Figure 4:
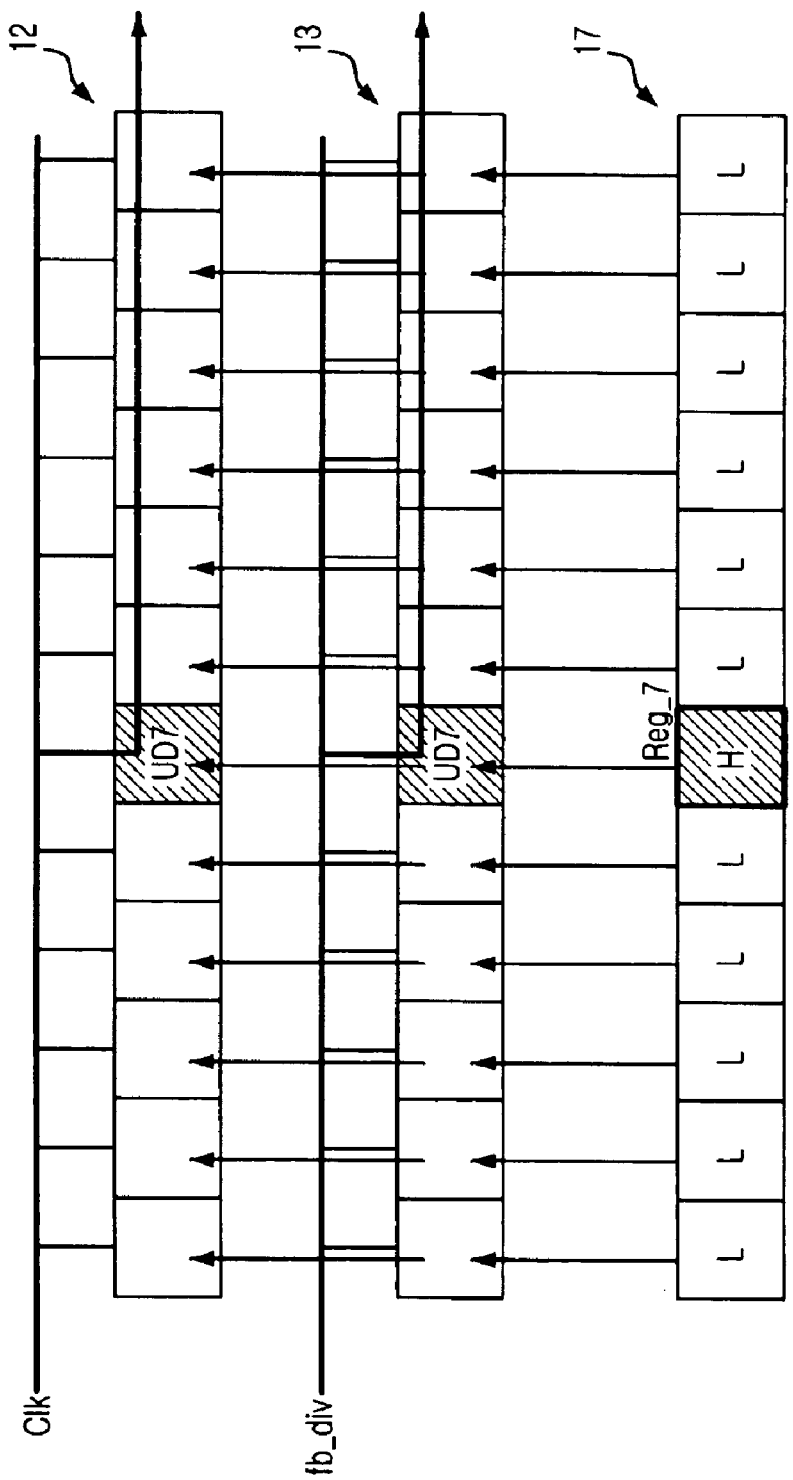
FIG. 4 is a schematic view illustrating the conventional shift register and the delay line.
Figure 10:
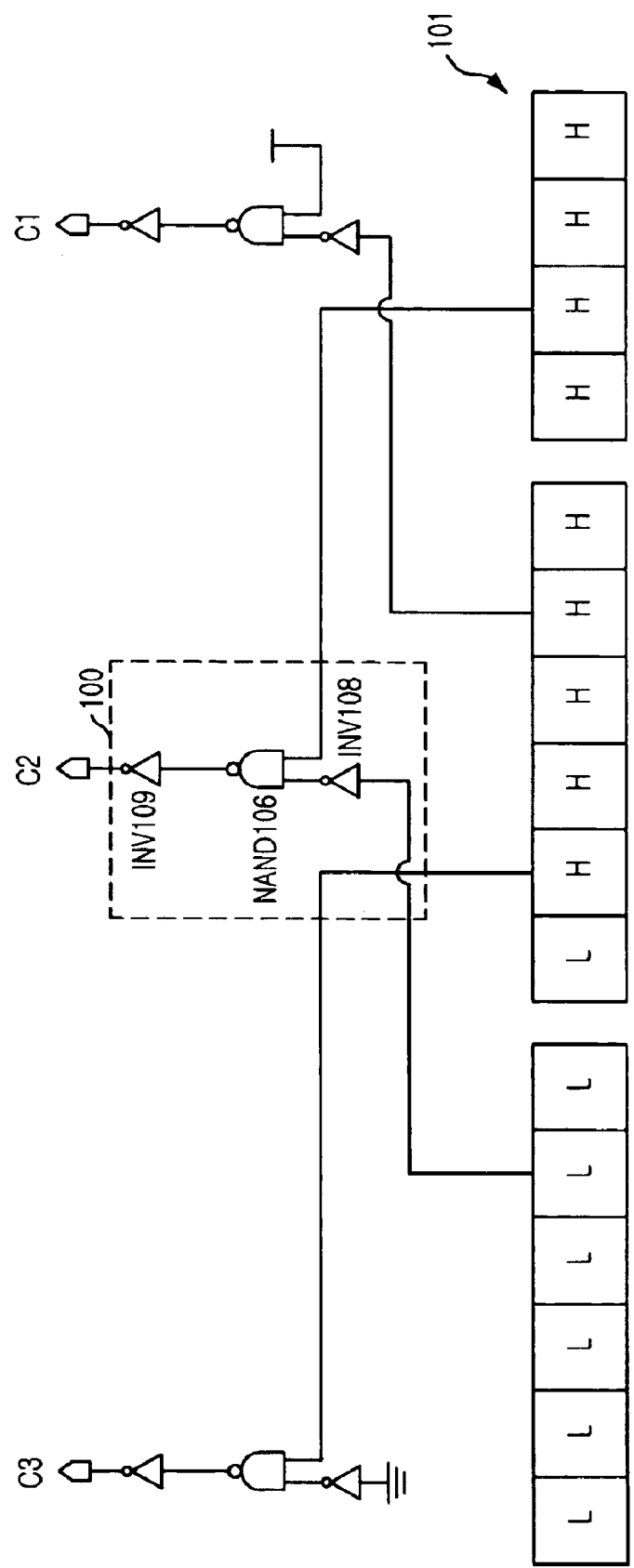
FIG. 10 is a schematic diagram illustrating the generation of a delay selection signal.

FIG. 10 is a schematic diagram illustrating the generation of the delay selection signal Ci, being different from the first to third logic summation circuits 71 to 73 as shown in FIG. 7. This scheme shown in FIG. 10 may not be employed in other digital DLLs and may be employed only in the register controlled DLL. In the case of the register controlled DLL, the delay control unit 27 is made up of the shift register controller 31 and the shift register 30 as illustrated in FIG. 5. In the present invention, the shift register 30 itself is the same as that in FIG. 3.

Referring again to FIG. 10, the latched value is used instead of the output signal of the delay control unit 27. A latch circuit 101 in the shift register 30 has a positive output terminal (Q) and a negative output terminal (/Q)(as illustrate in FIG. 3). At the initial state, all the negative output terminals of the latch circuit 101 are in a low voltage level and a high logic value is shifted in a shift left operation on a basis of one bit. In FIG. 10, the shift left operation is carried out up to the ninth latch circuit and, in this case, the tenth unit delayer is selected.

Since the latched value of the shift register 30 indicates a continuous state, a delay group, in which the latched value is varied, can be selected by grouping the latch circuits of the shift register 30 which are correspondent to the delay groups of the delay line and XORing a latched value in a specific position of the previous delay group and a latched value in a specific position of the next delay group.

FIG. 10 shows an example in which the delay group selection signal C2 is activated and an exclusive logic summation circuit (XOR circuit) 100 exclusively and logically sums the latched value of "the uppermost latch −1' in the lower group and the latched value of "the lowermost latch +1' in the lower group. The reason why the boundary latch value in each delay group is not used is that the use of the boundary latch value can generate an error. In the case where the boundary latch value is used, an undesired delay group is selected because the delay selection signals are determined by adjacent latch values of the shift register 30.

The XOR circuit 100 includes an inverter INV108 to invert a latched value from a specific position of the upper delay group, a NAND gate NAND106 receiving an output signal of the inverter INV108 and a latched value from a specific position of the lower delay group, and an inverter INV109 to invert an output signal of the NAND gate NAND106. Although this XOR circuit 100 does not have an XOR gate, this achieves an XOR operation by using a characteristic of shift left operation of the shift register 30. In the case of an XOR circuit corresponding to the lowermost group, a power supply Vdd is applied to the NAND gate as an input signal of thereof because there is no further lower group and, in the case of an XOR circuit corresponding to the uppermost group, a ground voltage level Vss is applied to the NAND gate as an input signal of thereof because there is no further upper group As apparent from the above, the present invention can reduce the current loss in the digital DLL and also reduce power consumption in the SDRAMs (Synchronous DRAM) and DDR SDRAMs.

Although the preferred embodiments of the invention have been disclosed for illustrative purposes, those skilled in the art will appreciate that various modifications, additions and substitutions are possible, without departing from the scope and spirit of the invention as disclosed in the accompanying claims. Although the present invention illustrates the power consumption in the register controlled DLL, this can be adapted for the other digital DLLs. Furthermore, the present invention can be adapted for other synchronous semiconductor memory devices and a synchronous logic circuit as well as the SDRAM. For example, in case of the digital DLL in the DDR SDRAM, a clock buffer, a delay line, a clock input controller are further included because both a positive clock signal and a negative external clock signal are used.

What is claimed is:

1. A digital delay locked loop comprising:
   first and second delay lines, each of which includes a plurality of delay groups, for delaying a source clock signal and a delay monitoring signal, wherein each of the delay groups include a plurality of programmable unit delayers;
   a delay model receiving an output signal of the second delay line for modeling a delay component of a clock signal path;
   comparing means for comparing a feedback clock signal from the delay model with a reference clock signal;
   delay control means for controlling an amount of delay time of the first and second delay lines in response to a comparison result of the comparing means; and
   first and second clock input control means, which selectively provides the source clock signal and the delay monitoring clock signal to one of delay groups in the first and second delay lines, respectively, in response to output signals of the delay control means.

2. The digital delay locked loop of claim 1, wherein the first clock input control means includes:
   a plurality of logic summation circuits for producing delay group selection signals by logically summing the output signals of the delay control means which are correspondent to each of the delay groups; and
   a plurality of first control logic circuits for selectively transfers the source clock signal to one of the delay groups in the first delay line in response to the delay group selection signal.

3. The digital delay locked loop of claim 2, wherein the second clock input control means includes:
   a plurality of logic summation circuits for producing dealy group selection signals by logically summing the output signals of the delay control means which are correspondent to each of the delay groups; and
   a plurality of first control logic circuits for selectively transfers the monitoring clock signal to one of the delay groups in the second delay line in response to the delay group selection signal.

4. The digital delay locked loop of claim 2, wherein the first clock input control means further includes:
   a second logic circuit for providing the source clock signal to an input terminal of the first control logic circuit in response to a read section signal.

5. The digital delay locked loop of claim 4, wherein the second control logic circuit includes:
   a NAND gate receiving the read section signal and the source clock signal; and
   an inverter for inverting an output signal of the NAND gate.

6. The digital delay locked loop of claim 2, wherein each of the first control logic circuit includes:
   a NAND gate receiving the delay group selection signal corresponding to the delay group and the source clock signal; and
   an inverter for inverting an output signal of the NAND gate.

7. The digital delay locked loop of claim 2, wherein each of the plurality of logic summation circuits includes:
   a NOR gate receiving the delay group selection signals corresponding to the delay groups; and
   an inverter for inverting an output signal of the NOR gate.

8. The digital delay locked loop of claim 2, wherein each of the plurality of logic summation circuits includes:
   a PMOS transistor for providing power supply to an output node in response to a reset signal;
   a plurality of NMOS transistors, which are in parallel coupled to the output node, for discharging the output node in response to output signals of the delay control means corresponding to the delay groups; and
   a latch circuit coupled to the output node.

9. The digital delay locked loop of claim 2, wherein each of the plurality of logic summation circuits includes:
   a logic summation circuit for logically summing an output signal of the delay control means, which is correspondent to each of the delay groups, and a boundary output signal of the delay control means, which is correspondent to a delay group adjacent to the corresponding delay groups.

10. The digital delay locked loop of claim 1, wherein the delay control means includes:
    a shift register controller for producing a shift control signal in response to a comparison result of the comparing means; and
    a shift register for determining an amount of delay time in response to the shift control signal.

11. The digital delay locked loop of claim 10, wherein the first clock input control means includes:
    a plurality of exclusive logic summation circuits, each of which exclusively and logically sums a latched value from a specific position of the shift register corresponding to a lower delay group of the corresponding delay group and a latched value from a specific position of the shift register corresponding to an upper delay group of the corresponding delay group in order to produce a delay group selection signal; and
    a plurality of control logic circuits for selectively providing the source clock signal to one of the delay groups in response to the delay group selection signal.

12. The digital delay locked loop of claim 11, wherein the exclusive logic summation circuit includes:
- a first inverter to invert a latched value from the specific position of the upper delay group;
- a NAND gate receiving an output signal of the first inverter and a latched value from the specific position of the lower delay group; and
- a second inverter to invert an output signal of the NAND gate.

13. The digital delay locked loop of claim 12, wherein the latched value is a value latched in latch circuits of upper/lower delay groups of the corresponding delay group, except for a boundary latch circuits.

14. The digital delay locked loop of claim 12, wherein the exclusive logic summation circuit corresponding to a lowermost delay group is couple to power supply and wherein the exclusive logic summation circuit corresponding to a uppermost delay group is couple to a ground voltage level.

15. The digital delay locked loop of claim 1, wherein the clock generating means includes:
- a clock buffer for buffering an external clock signal and for producing the source clock signal which is synchronized with an edge of the external clock signal; and
- a clock signal divider for dividing the source clock signal and for producing the delay monitoring clock signal and the reference clock signal.

16. A digital delay locked loop which includes a clock buffer, a clock divider, a phase comparator, a delay line, a dummy delay line, a shift register, a shift register controller, a DLL driver, and a delay model, the digital delay locked loop comprising:
- first and second clock input control means for controlling the delay line and the dummy delay line, respectively in response to a read command and inputting a first clock signal and a second clock signal to the delay line and the dummy delay line respectively,
- wherein each of the delay line and the dummy delay line includes a plurality of delay groups, each having a plurality of unit delayers, and wherein the first and second clock input control means provides the first clock signal and the second clock signal to one of the delay groups in the first and second delay lines, respectively, according to output signals of the delay control means.

17. The digital delay locked loop as recited in claim 16, wherein the first clock input control means disables the delay line when the read command is inactivated.

18. The digital delay locked loop as recited in claim 16, wherein the first clock input control means includes:
- a plurality of logic summation circuits for generating delay group selection signals by logically summing the output signals of the delay control means which are correspondent to each of the delay groups; and
- a plurality of first control logic circuits for selectively transfers the first clock signal to one of the delay groups in the delay line in response to the delay group selection signals.

19. The digital delay locked loop of claim 16, wherein the second clock input control means includes:
- a plurality of logic summation circuits for generating delay group selection signals by logically summing the output signals of the delay control means which are correspondent to each of the delay groups; and
- a plurality of first control logic circuits for selectively transfers the second clock signal to one of the delay groups in the dummy delay line in response to the delay group selection signals.

* * * * *